United States Patent [19]

Curtis et al.

[11] Patent Number: 4,608,118

[45] Date of Patent: Aug. 26, 1986

[54] REACTIVE SPUTTER ETCHING OF METAL SILICATE STRUCTURES

[75] Inventors: Bernard J. Curtis, Gattikon; Hans R. Brunner, Steinmaur, both of Switzerland

[73] Assignee: RCA Corporation, Princeton, N.J.

[21] Appl. No.: 702,338

[22] Filed: Feb. 15, 1985

[51] Int. Cl.$^4$ .............................. C23F 1/02; B44C 1/22; C03C 15/00; C03C 25/06

[52] U.S. Cl. ................................. 156/643; 156/646; 156/655; 156/656; 156/659.1; 156/657; 204/192 E; 252/79.1

[58] Field of Search ............... 156/643, 646, 655, 656, 156/657, 659.1; 204/192 EC, 192 E; 430/313, 318; 427/38, 39, 88; 252/79.1

[56] References Cited

U.S. PATENT DOCUMENTS

| | | | |
|---|---|---|---|
| 4,450,042 | 5/1984 | Purdes | 252/79.1 X |
| 4,479,850 | 10/1984 | Beinvogl et al. | 252/79.1 X |
| 4,544,444 | 10/1985 | Chang | 156/643 |

OTHER PUBLICATIONS

Herb et al., Abstract No. 291, Extended Abstracts, Electrochemical Society, vol. 81-2, pp. 710 and 711 (1981).

Beinvogl et al., Solid State Tech., Apr., 1983, pp. 125–129.

Clark et al., Solid State Tech., Apr., 1984, pp. 235–242.

Light et al., J. Electrochem. Soc. vol. 131, No. 2, pp. 459–461, 1984.

Park et al., J. Electrochem. Soc. vol. 131, No. 1, pp. 214 and 215, 1984.

Heimann et al., J. Electrochem. Soc. vol. 131, No. 4, pp. 881–885, 1984.

*Primary Examiner*—William A. Powell
*Attorney, Agent, or Firm*—B. E. Morris; R. H. Swope

[57] ABSTRACT

Polycide structures are etched with silicon tetrachloride. The etch is preferably carried out at a pressure of about 20 to 60 mtorr and overetching to remove stringers is then carried out at an increased pressure, i.e. at least about 100 mtorr. There is obtained an anisotropic etch with substantially no stringers or linewidth loss. When selectivity of etch vis-á-vis an underlying layer of gate oxide must be enhanced, from about 60 to 90 percent by volume of the silicon tetrachloride is replaced with chlorine just prior to completion of the etch.

12 Claims, No Drawings

REACTIVE SPUTTER ETCHING OF METAL SILICATE STRUCTURES

This invention relates to the anisotropic etching of metal silicide structures, particularly such structures comprising a layer of refractory metal silicide overlying a layer of doped polycrystalline silicon.

BACKGROUND OF THE INVENTION

The replacement of doped polycrystalline silicon as a gate and interconnection material in very high speed integrated circuits (VHSIC) with other materials having a lower sheet resistivity and, therefore, increased speed, is of substantial interest in the electronics industry. A material which has been used in such devices is a bi-layer structure composed of a refractory metal silicide overlying a layer of doped polycrystalline silicon, commonly referred to as a "polycide" structure.

It is desirable that the gate and interconnection dimensions in VHSIC devices be as small as 0.5 micrometer. It is difficult to achieve the degree of profile control required to etch a structure to such fine dimensions when the structure is comprised of two or more layers of different material because one layer may etch anisotropically while the other etches partially isotropically due to differing etch mechanisms and rates. This can produce undercutting, particularly if substantial overetching is required to remove conductive residues called "stringers" which commonly form on vertical walls during etching. Achieving proper profile control becomes even more difficult when the substrate has epitaxial silicon islands or other topographical features having vertical walls. When a layer of polycide is etched to form a line overlying such a topographical feature, the potential for stringer formation is substantially increased.

Finally, it is necessary that there be an acceptable degree of etch selectivity between the silicon layer of a polycide structure and the underlying substrate layer. It is frequently the case that polycide structures overlie layers of gate oxide which are very thin, e.g. 200 angstroms. Unless there is sufficient etch selectivity, the overetching necessary to assure complete removal of stringers may etch through such thin layers of gate oxide causing any device made from the structure to short out due to contact between the polycide material and conductive layers underlying the gate oxide. An improved etching process for polycide materials is provided in accordance with this invention.

SUMMARY OF THE INVENTION

A layer of a refractory metal silicide, or a layer of doped polycrystalline silicon having thereover a layer of a refractory metal silicide, is etched by reactive sputter etching with silicon tetrachloride, preferably in two stages, wherein overetching to remove stringers is carried out at increased pressure. When a polycide structure overlies a very thin layer of gate oxide, the final etching may be done with a mixture of silicon tetrachloride and at least 60 percent by volume of chlorine to provide greater selectivity of etching with respect to the underlying oxide.

DETAILED DESCRIPTION OF THE INVENTION

The etching process of this invention is effective on art-recognized metal silicides such as tantalum, tungsten, titanium, niobium and molybdenum silicides. The process will be described with reference to tantalum silicide, however.

The layer of metal silicide may be deposited on a suitable substrate, usually an insulating material such as silicon dioxide, by conventional methods, preferably by magnetron sputtering. When deposited in this way as a single layer, tantalum silicide is conventionally deposited in a stochiometic ratio of one part tantalum per two parts of silicon. A polycide structure is formed by initially depositing a layer of doped polycrystalline silicon and then depositing a layer of metal silicide thereover.

The silicon layer is preferably deposited in the amorphous state by low pressure chemical vapor deposition (LPCVD) from a silicon-containing vapor such as silane at a temperature of 560°–580° C. The silicon layer is heated in a conventional furnace to a temperature of from about 850° to 950° C., preferably about 900° C., for from five to fifteen minutes under an inert atmosphere, such as nitrogen, to convert it to the polycrystalline state. A polycrystalline silicon layer initially deposited in the amorphous state is superior in physical properties, particularly smoothness, to a layer deposited in the polycrystalline state. This is described by Widmer et al. in copending U.S. patent application, Ser. No. 441,371, filed Nov. 12, 1982, entitled "Polycrystalline Silicon Layers for Semiconductor Devices", the disclosure of which is incorporated herein by reference.

The silicon layer may be doped in-situ or by conventional diffusion techniques. In the former, a suitable dopant, preferably phosphine, is added to the vapor containing a source of silicon from which the layer is formed by LPCVD. In the latter, a suitable dopant, preferably a source of phosphorus such as phosphorus oxychloride, is pumped into the furnace during the above-described heating step and the structure is heated for an additional time, generally from five to thirty minutes to cause diffusion.

A layer of refractory metal silicide is then deposited over the polycrystalline silicon layer by any suitable technique, e.g. by magnetron sputtering. The layer of tantalum silicide is preferably deposited tantalum rich, e.g. in a molar ratio of about one part of tantalum per 1.6 parts of silicon. The tantalum silicide layer is thereafter conventionally annealed, e.g. by heating in an argon furnace at a temperature of from about 850° to 950°, preferably about 900° C., for thirty minutes.

Alternatively, a polycide structure may be deposited by low pressure chemical vapor deposition in a single vessel as disclosed by Widmer et al. in copending U.S patent application Ser. No. 592,397, filed Mar. 22, 1984, Pat. No. 4,504,521, entitled "LPCVD Deposition of Tantalum Silicide", the disclosure of which is incorporated herein by reference. The structure is then annealed to convert the tantalum silicide layer, which is deposited tantalum rich, to $TaSi_2$. Annealing also converts the silicon, which is preferably deposited in the amorphous state, to the polycrystalline state. The interface of the two layers formed by this method is exceptionally uniform.

In accordance with this invention, a layer of resist material is deposited over the metal silicide layer, irradiated through a mask and developed to form a desired pattern. When the substrate has topography, it may be advantageous to utilize a multilayer resist system comprising one or more planarizing layers and/or a plurality of resist layers. The term "layer of resist material" as utilized herein includes such multilayer resist systems.

The type of resist material, mode of irradiation and development are all conventional and are not critical to the process of this invention. It is necessary that the resist utilized be resistant to the subject etch mixture. A preferred material, which may be used as a single layer or as part of a multilayer resist system, is a positive material available from Hunt Chemical Co. under the trademark HPR-204.

In accordance with this invention, the polycide structure is dry etched in a conventional apparatus by reactive sputter etching utilizing silicon tetrachloride as the etch gas. Etching of the polycide structure may be carried out before annealing in contrast to etchants currently used, most of which are only effective after the structure has been annealed. Etching is carried out at a typical plasma power density of 0.3 watts per sq. cm. and a pressure of from about 20 to 120, preferably from about 20 to 60, millitorr.

The pressure utilized affects the etching selectivity of silicon to an underlying silicon dioxide layer. The selectivity, i.e., the differential etch rate of polysilicon to silicon dioxide, varies from about 10:1 at 20 mtorr to about 30:1 at 60 mtorr at 0.3 watts/sq. cm. and a silicon tetrachloride gas feed rate of 12 sccm. It has been found that the etching behavior, i.e. etch rate and selectivity, of unannealed LPCVD ($Ta_5Si_3$) polycide, annealed LPCVD ($TaSi_2$) polycide and unannealed magnetron sputtered ($TaSi_2$) polycide are very similar with the subject etchant. The etch profiles of unannealed and annealed LPCVD polycides are also equivalent. Further, silicon tetrachloride produces an anisotropic etch with essentially no loss in linewidth of the resist pattern.

Etching of polycide structures with silicon tetrachloride is preferably carried out in two stages, particularly when the polycide structure overlies surface topography. The initial etching, which removes the polycide structure completely, is carried out at from about 20 to 60 millitorr. The period of overetching necessary to remove conductive residues on vertical walls which are known as "stringers" is suitably carried out at increased pressure. During the overetch period, the pressure is increased to at least about 100 mtorr, preferably between about 100 and 120 millitorr. It has been found that overetching for from about 50 to 150 percent of the time required to initially etch the polycide structure is necessary to remove substantially all such stringers with a minimal amount of linewidth loss.

When the polycide structure to be etched overlies an exceptionally thin layer of gate oxide, the selectivity of the silicon oxide etch can be substantially increased by replacing from about 60 to 90, preferably about about 75, percent by volume of the silicon tetrachloride with chlorine after most of the polycide structure has been etched. By "most of the polycide structure" is meant the metal silicide layer and a major portion, preferably at least about 75 percent, of the underlying silicon layer are etched in the first stage. The remaining silicon layer is then etched with the conditions otherwise being substantially unchanged. For example, at 80 mtorr, an 0.3 watts/sq.cm. and 12 sccm gas flow, replacement of about 75 percent by volume of silicon tetrachloride with chlorine raises the selectivity of silicon over silicon dioxide from about 30:1 to about 100:1. Chlorine should only be added to silicon tetrachloride when necessary to protect a thin gate oxide layer, however, because it increases the isotropic character of the etch thereby causing some undercutting and, in most cases, will accelerate erosion of the resist pattern. Both of these effects can be minimized by selecting the point at which to initiate chlorine flow. Such a point can be readily determined using the etch rates of the polycide layers and is considered to be within the skill of the art.

The process of etching polycide structures provided herein is advantageous in that it utilizes a simple, one component etchant in contrast to conventional etchants, most of which are complex and contain at least two components. Silicon tetrachloride does not have the problem of toxicity inherent in most etchants for polycide structures, particularly those containing carbon tetrachloride. Finally, the overetching often necessary to remove stringers can be carried out under an increased pressure of silicon tetrachloride without significant undercutting or loss of linewidth definition.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Single crystal silicon wafers, three inches in diameter, were utilized as substrates. A layer of silicon dioxide 5000 angstroms thick was grown on the wafers and lithographically patterned to form a grating of 2 micrometers lines and spaces.

A first wafer were placed in a LPCVD reactor in a quartz tube which was heated 575°. Deposition of doped amorphous silicon was carried out at 350 mtorr pressure and a flow of 300 $cm^3$/min. of silane and 24 $cm^3$/min of 1 percent phosphine by volume in nitrogen to deposit a layer 350 nanmeters thick.

The flow of the phosphine/nitrogen mixture was stopped, the flow of silane adjusted to 40 $cm^3$/min., and a 20 $cm^3$/min. flow of nitrogen introduced into the chamber. Tantalum pentachloride from a source heated to 152° was flowed into the chamber at a calculated rate of 15 $cm^3$/min. Flow was continued to deposit a layer of tantalum trisilicide ($Ta_5Si_3$) 2000 angstroms thick.

A second wafer was coated with doped, amorphous silicon and tantalum trisilicide in the same manner. After deposition was completed, the temperature in the reactor was raised to 850° and maintained under dry nitrogen at 200 mtorr for thirty minutes to convert the silicon to the polycrystalline state and the tantalum trisilicide to tantalum silicide ($TaSi_2$).

A layer of doped, amorphous silicon was formed on a third wafer by LPCVD as above. The wafer was transferred to a conventional magnetron sputtering apparatus and a layer of tantalum silicide ($TaSi_2$) 3000 angstroms thick deposited thereover under an argon atmosphere.

The wafers were spin-coated with a 600 nanometer thick layer of the positive resist HPR-204, Hunt Chemical Co. The resist layer was irradiated with a scanning electron microscope equipped with a microprocessor and developed with an aqueous developer supplied by the manufacturer to leave a pattern of 2 micrometer wide lines and spaces.

The wafers were individually placed into an aluminum vacuum chamber 30 cm in diameter which served as the gounded electrode. The powered electrode was 15 cm in diameter and the ratio of grounded area to powered area was 23:1. The system could achieve process pressures of 120 mtorr at a gas throughput of only 12 sccm. At this throughput it was not necessary to heat the reservoir of silicon tetrachloride.

The wafers were individually etched at a pressure of 20 mtorr with a plasma power density of 0.3 watts/sq.cm. Etching was monitored with a He/Ne laser interferometer. When etching was completed, about six minutes, the pressure was increased to 120 mtorr and etching was resumed for an additional six minutes.

An anisotropic etch was achieved in each instance. The etch rates and profiles of the three wafers were remarkably similar. The overetching necessary to remove substantially all stringers also caused some erosion of the underlying oxide layer and a marginal amount of undercutting in each instance. Neither of these was considered detrimental to the functioning of a device incorporating any of the test wafers.

EXAMPLE 2

A wafer having a patterned layer of silicon dioxide and an LPCVD polycide structure deposited as in Example 1 was used as a substrate. A patterned layer of resist was formed on the substrate and reactive sputter etching with silicon tetrachloride was initiated under the same conditions as Example 1.

When the laser interferometer indicated that approximately 600 angstroms or 20 percent of the silicon layer remained, 75 percent by volume of the silicon tetrachloride was replaced with chlorine. Etching was continued for five minutes beyond the endpoint determination.

Although there was marked erosion of the resist layer and some undercutting, there was substantially no etching of the substrate oxide layer and no stringers remained on the vertical walls.

We claim:

1. A process of forming a patterned layer of a metal silicide on a substrate comprising:
   (a) depositing the metal silicide on the substrate;
   (b) providing a patterned layer of a resist material overlying the metal silicide layer; and
   (c) anisotropically reactive sputter etching the exposed portion of the metal silicide layer with an etchant consisting essentially of silicon tetrachloride.

2. A process in accordance with claim 1, wherein the metal silicide is tantalum silicide.

3. A process in accordance with claim 1, wherein the layer of metal silicide is annealed after the etching step.

4. A process of forming a patterned polycide structure on a substrate comprising:
   (a) providing a layer of doped silicon on the substrate;
   (b) depositing a layer of a metal silicide thereover;
   (c) providing a patterned layer of a resist material overlying the metal silicide layer; and
   (d) anisotropically reactive sputter etching the exposed portion of the structure with an etchant consisting essentially of silicon tetrachloride.

5. A process in accordance with claim 4, wherein the structure is etched at a pressure of from about 20 to 120 millitorr.

6. A process in accordance with claim 5, wherein the structure is etched at a pressure of from about 20 to 60 millitorr.

7. A process in accordance with claim 6, wherein, after the etching of the structure is substantially complete, the pressure is increased and etching is extended for a period of time sufficient to remove stringers from the etched structure.

8. A process in accordance with claim 7, wherein said extended etch is carried out at a pressure of at least about 100 millitorr.

9. A process in accordance with claim 7, wherein said extended etch comprises from about 50 to about 150 percent of the time required to etch the structure.

10. A process in accordance with claim 4, wherein the structure is annealed prior to said etching step.

11. A process in accordance with claim 4, wherein the structure is annealed subsequent to said etching step.

12. A process in accordance with claim 4, wherein after the metal silicide layer and a major portion of the silicon layer have been etched, from about 60 to about 90 percent by volume of the silicon tetrachloride is replaced with chlorine and the etching step is thereafter completed.

* * * * *

UNITED STATES PATENT AND TRADEMARK OFFICE
CERTIFICATE OF CORRECTION

PATENT NO. : 4,608,118

DATED : August 26, 1986

INVENTOR(S) : Bernard John Curtis et al.

It is certified that error appears in the above-identified patent and that said Letters Patent is hereby corrected as shown below:

Change title to:

"Reactive Sputter Etching of Metal Silicide Structures"

Signed and Sealed this

Eleventh Day of November, 1986

*Attest:*

DONALD J. QUIGG

*Attesting Officer*  *Commissioner of Patents and Trademarks*